United States Patent
Lee

Patent Number: 6,051,463
Date of Patent: Apr. 18, 2000

[54] METHOD FABRICATING A DATA-STORAGE CAPACITOR FOR A DYNAMIC RANDOM-ACCESS MEMORY DEVICE

[75] Inventor: Hsiang-Fan Lee, Ta-Li, Taiwan

[73] Assignee: United Integrated Circuits Corp., Hsinchu, Taiwan

[21] Appl. No.: 09/213,695

[22] Filed: Dec. 17, 1998

[30] Foreign Application Priority Data

Aug. 18, 1998 [TW] Taiwan .................................. 87113559

[51] Int. Cl.$^7$ .............................................. H01L 21/8242
[52] U.S. Cl. ............................................ 438/253; 438/657
[58] Field of Search ..................................... 438/253, 256, 438/396, 399, 596, 657

[56] References Cited

U.S. PATENT DOCUMENTS

| | | | |
|---|---|---|---|
| 5,726,086 | 3/1998 | Wu | 438/253 |
| 5,909,620 | 3/1998 | Wu | 438/253 |

*Primary Examiner*—Chandra Chaudhari
*Attorney, Agent, or Firm*—Jiawei Huang; J. C. Patents

[57] ABSTRACT

A semiconductor fabrication method is provided for fabricating a data-storage capacitor for DRAM (dynamic random-access memory) device, which can allow the resulting capacitor to have a large capacitance and also allows a higher yield rate for the DRAM manufacture process. This method is used on a semiconductor substrate that is already formed with a transfer field effect transistor having a gate and a pair of source/drain regions. By this method, a dielectric layer, an etch-end layer, and an insulating layer are successively formed over the dielectric layer. Then, a contact hole is formed to expose a selected one of the source/drain regions of the transistor. In this contact hole and over the insulating layer, a main conductive trunk is formed, which is substantially T-shaped in cross section, with the root thereof being electrically connected to the source/drain region. Subsequently, an overhanging conductive branch is formed to the main conductive trunk. The overhanging conductive branch and the main conductive trunk in combination constitute a storage electrode. Then, an etching process is performed to etch away all the remaining insulating layer over the etch-end layer. After this, a dielectric film is formed over the storage electrode, and then a conductive block is formed over dielectric film to serve as a cell electrode. The cell electrode, the dielectric film, and the storage electrode in combination constitute the intended data-storage capacitor.

20 Claims, 4 Drawing Sheets

METHOD FABRICATING A DATA-STORAGE CAPACITOR FOR A DYNAMIC RANDOM-ACCESS MEMORY DEVICE

CROSS-REFERENCE TO RELATED APPLICATION

This application claims the priority benefit of Taiwan application serial no. 87113559, filed Aug. 18, 1998, the full disclosure of which is incorporated herein by reference.

BACKGROUND OF THE INVENTION

1. Field of the Invention

This invention relates to semiconductor fabrication technology, and more particularly, to a method of fabricating a data-storage capacitor for a dynamic random-access memory (DRAM) device.

2. Description of Related Art

A computer system typically includes a central processing unit and a memory unit. Presently, the DRAM (dynamic random access memory) is widely used as the primary memory of computer systems. Basically, each single DRAM cell is composed of a transfer field effect transistor (TFET) and a data-storage capacitor.

FIG. 1 is a schematic diagram showing the equivalent circuit representation of a single DRAM cell. As shown, a single DRAM cell is composed of a TFET T and a data-storage capacitor C. The data-storage capacitor C is composed of two electrodes 100, 102 and a dielectric layer 101 sandwiched between the two electrodes 100, 102. By convention, the electrode 100 connected to the TFET is called a storage electrode, while the opposing electrode 102 is called a cell electrode. The TFET T is connected in such a manner that its gate is connected to a word line WL, its source (or drain) is connected to a bit line BL, and its drain (or source) is connected to the storage electrode 100. Whether the DRAM cell stores a binary value 0 or 1 is dependent on whether the data-storage capacitor C is charged or uncharged. If uncharged, it represents the storage of a first binary value, for example 0. Otherwise if charged, it represents the storage of a second binary value, for example 1. The data stored in the DRAM cell can be accessed via the word line WL and the bit line BL. The voltage state on the word line WL controls the ON/OFF state of the TFET T. When the TFET T is ON, data can be either read out from or stored into the data-storage capacitor C via the bit line BL.

In the fabrication of DRAMs having less than 1 MB (megabit) in storage capacity, it is a customary practice to utilize a two-dimensional capacitor called a planar-type capacitor as the data-storage capacitor for each DRAM cell. However, since the planar-type capacitor takes quite a large layout area on the substrate to implement, it is unsuitable for use in very large integration DRAMs. For 4 MB or higher DRAMs, a three-dimensional capacitor such as a stacked-type or a trench-type capacitor, is utilized instead.

Compared to the planar-type capacitor, both the stacked-type and the trench-type capacitors can provide a larger capacitance that allows the DRAM device to be further downsized while nonetheless allowing good charge (data)-retaining capability. However, when it comes to 64 MB or higher DRAMs, both the stacked-type and the trench-type capacitors also become inadequate.

One solution to the foregoing problem is to utilize the so-called fin-type capacitor, which has a very large capacitance due to the forming of a stacked structure of a plurality of horizontally-extended conductive layers that are formed into a fin-like shape to serve as the storage electrode. Research on the fin-type capacitor is published in the paper entitled "3-Dimensional Stacked Capacitor Cell for 16M and 64M DRAMs" by Ema et al., International Electron Devices Meeting, pp. 592–595, December 1988. Moreover, patents that disclose methods for fabricating fin-type capacitors include U.S. Pat. Nos. 5,071,783; 5,126,810; and 5,206,787, to name a few.

Another solution for 64M DRAMs is to utilize the so-called cylindrical-type capacitor, which can provide a very large capacitance due to the forming of a vertically extended and cylindrically shaped electrode structure. This structure can help increase the surface area of the electrode, thereby increasing the capacitance of the capacitor. Research on the cylindrical-type capacitor is published in the paper entitled "Novel Stacked Capacitor Cell for 64-Mb DRAM", by Wakamiya et al., in the 1989 Symposium on VLSI Technology Digest of Technical Papers, pp. 69–70. Moreover, U.S. Pat. No. 5,077,688 discloses a method for fabricating a cylindrical-type capacitor.

With the trend toward high integration for DRAMs, the various circuit components in the DRAMs, including the data-storage capacitors, must be reduced in size. However, the downsizing of a capacitor also means that the capacitance of the downsized capacitor is reduced, which causes the charge retaining capability of the downsized capacitor to be reduced. The data retaining capability of the downsized DRAM may thus be unreliable. Moreover, as the capacitance is reduced, the likelihood of soft errors arising from the incidence of α-rays increases. Therefore, there still exits a need in the DRAM industry for a new method that can be used to fabricate a data-storage capacitor in a downsized DRAM device while nonetheless provide an adequate capacitance.

SUMMARY OF THE INVENTION

It is therefore an objective of the present invention to provide a method for fabricating a data-storage capacitor for a DRAM device, which can allow the resulting data-storage capacitor to have a large capacitance.

It is another objective of the present invention to provide a method for fabricating a data-storage capacitor for DRAM device, which can help increase the process tolerance and allow a higher yield rate and lower cost for the DRAM manufacturing process.

In accordance with the foregoing and other objectives of the present invention, a method for fabricating a data-storage capacitor for a DRAM device is provided.

The method of the invention comprises the steps of: forming a dielectric layer over the substrate to cover the gate and source/drain regions of the TFET; forming an etch-end layer over the dielectric layer; forming an insulating layer over the etch-end layer; forming a contact hole which penetrates through the insulating layer, the etch-end layer, and the dielectric layer to expose a selected one of the source/drain regions of the TFET; depositing a conductive material into the contact hole and over the insulating layer to form a first conductive layer; performing a selective removal process to remove a selected part of the first conductive layer that is laid beyond a predefined range about the contact hole, with the remaining part of the first conductive layer serving as a main conductive trunk which is substantially T-shaped in cross section; performing an etching process with the main conductive trunk serving as mask to thereby etch the unmasked part of the insulating layer until reaching a predefined depth into the insulating layer but not reaching the etch-end layer; forming an overhanging conductive branch to the main conductive trunk; the overhanging conductive branch and the main conductive trunk in combination constituting a first electrode serving as storage electrode; performing an etching process with the etch-end layer serving as etch-end point to thereby etch away all the remaining part of the insulating layer; forming a dielectric film over all the exposed surfaces of the combined structure of the main conductive trunk and the over-hanging conductive branch; and forming a conductive block covering all the exposed surfaces of the dielectric film to serve as a cell electrode; the cell electrode, the dielectric film, and the first electrode in combination constituting the intended data-storage capacitor.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 2A–2F are schematic, cross-sectional diagrams used to depict the steps involved in the method of the invention for fabricating a data-storage capacitor for a DRAM device.

Figure 1:
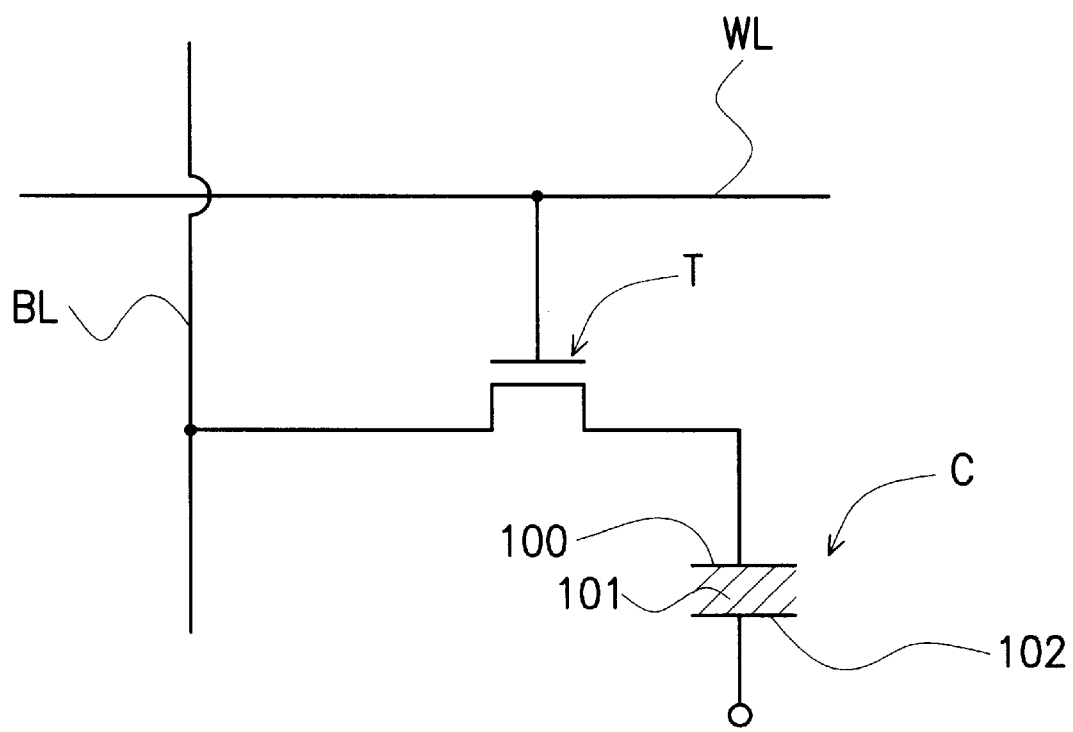
FIG. 1 is a schematic diagram showing the equivalent circuit representation of a single DRAM cell.
Figure 2A:
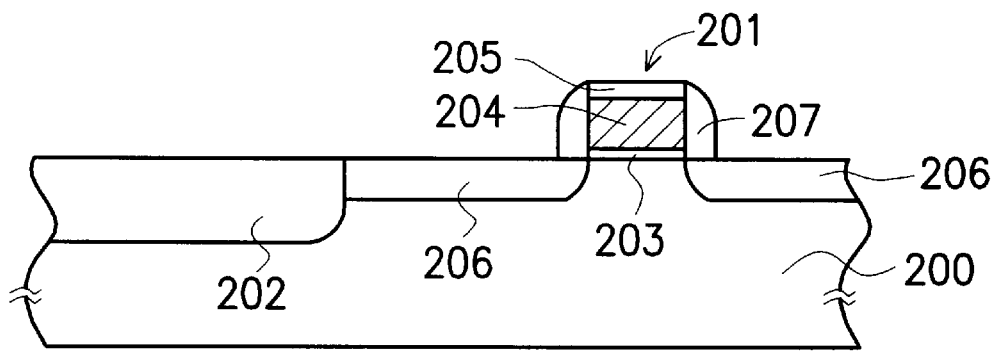
FIGS. 2A–2F are schematic, cross-sectional diagrams used to depict the steps involved in the method of the invention for fabricating a data-storage capacitor for DRAM device.

Referring first to FIG. 2A, the DRAM device is constructed on a semiconductor substrate 200, such as a P-type silicon substrate. A plurality of field isolation structures 202 (only one is illustrated) are formed at predefined locations in the substrate 200 to define a plurality of active regions, each being used to form one single DRAM cell. The field isolation structures 202 can be formed through, for example, a LOCOS (Local Oxidation of Silicon) process or an STI (Shallow Trench Isolation) process.

Next, a transfer field effect transistor (TFET) 201 is formed in each active region of the substrate 200. The TFET 201 is composed of a gate oxide layer 203, a gate 204, a gate topping layer 205, a sidewall spacer 207, and a pair of source/drain regions 206. The stacked structure of the gate oxide layer 203, the gate 204, and the gate topping layer 205 can be formed through., for example, a first step of performing a thermal oxidation process to form a thin oxide layer over the substrate 200; a second step of forming a conductive layer over the oxide layer, preferably from doped polysilicon through a CVD (chemical-vapor deposition) process; a third step of forming an insulating layer over the conductive layer, preferably from silicon nitride through a CVD process; and a fourth step of performing a selective removal process on selected portions of the stacked structure of the insulating layer, the conductive layer, and the oxide layer until the top surface of the substrate 200 is exposed. Through this process, the remaining part of the oxide layer serves as the gate oxide layer 203, the remaining part of the conductive layer serves as the gate 204, and the remaining part of the insulating layer serves as the gate topping layer 205. The sidewall spacer 207 can be formed through, for example, a first step of forming an insulating layer over the entire wafer and a second step of performing an etch-back process on the insulating layer. Through this process, the remaining part of the insulating layer serves as the sidewall spacer 207 on the sidewall of the stacked structure of the gate oxide layer 203, the gate 204, and the gate topping layer 205.

Figure 2B:
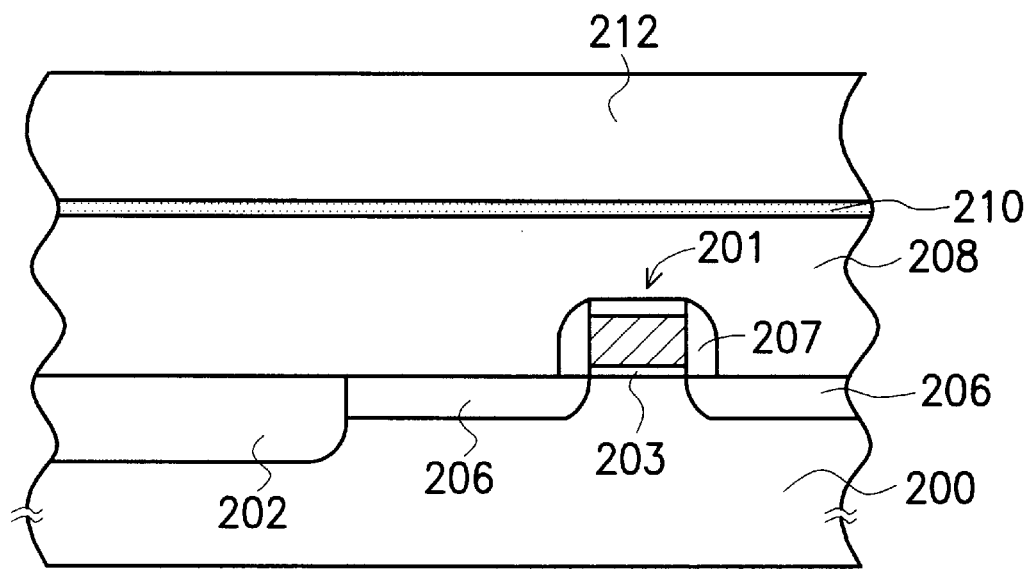

Referring next to FIG. 2B, in the subsequent step, a dielectric layer 208 is formed over the substrate 200 to a thickness above the topmost surface of the TFET 201. The dielectric layer 208 is preferably formed from borophosphosilicate glass (BPSG) through a CVD process. Next, a thin etch-end layer 210 is formed over the di-electric layer 208, preferably from silicon nitride ($Si_3N_4$) or silicon-oxy-nitride ($SiO_xN_y$), through a CVD process. Furthermore, an insulating layer 212 is formed over the etch-end layer 210, preferably from silicon oxide through a CVD process.

Figure 2C:
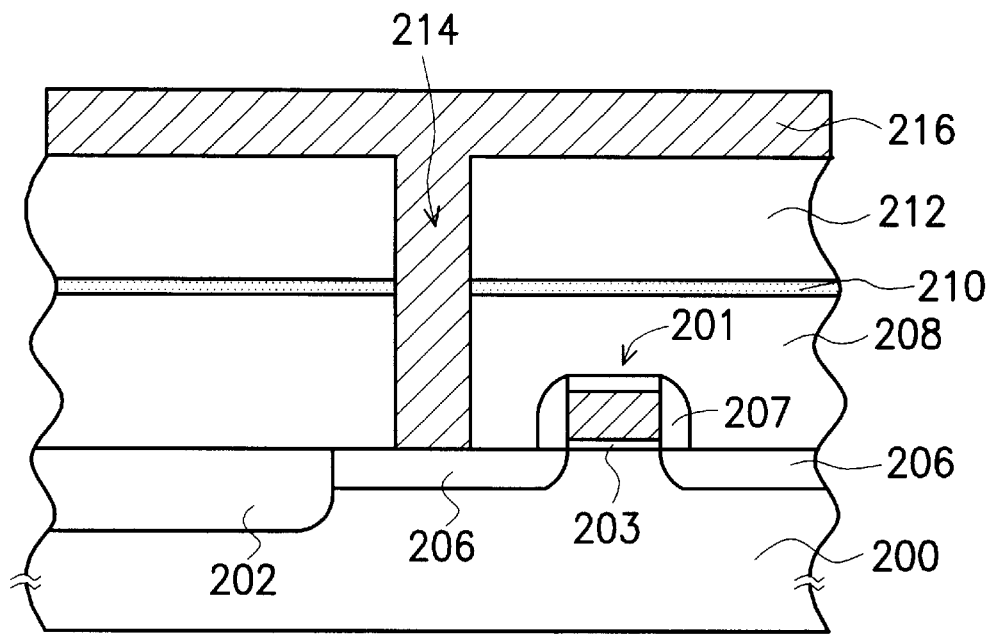

Referring further to FIG. 2C, in the subsequent step, a selective removal process is performed to form a contact hole 214 which penetrates successively through the insulating layer 212, the etch-end layer 210, and the dielectric layer 208 to expose a selected one of the source/drain regions 206 of the TFET 201. Next, a first conductive layer 216 is formed over the insulating layer 212 and also fills the contact hole 214. The conductive layer 216 can be formed through, for example, a first step of depositing polysilicon into the contact hole 214 and over the insulating layer 212 through a CVD process and a second step of doping an impurity element, such as N-type impurity ions, into the polysilicon layer to increase the conductivity thereof.

Figure 2D:
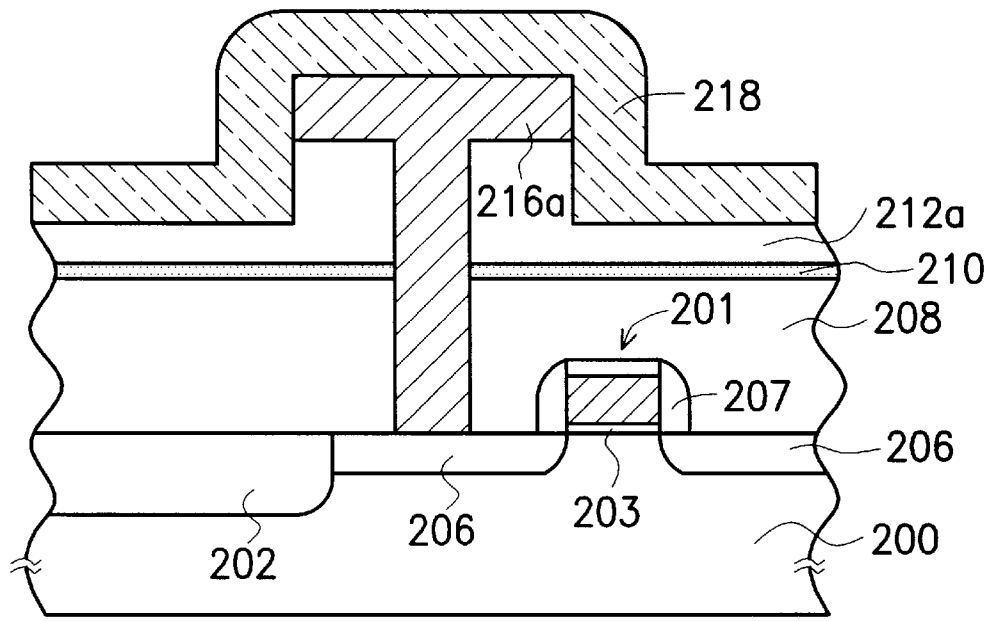

Referring next to FIG. 2D in the subsequent step, a selective removal process is performed to remove a selected part of the conductive layer 216 (FIG. 2C) that is laid beyond a predefined range around the contact hole 214. The remaining part of the conductive layer is here designated by the reference numeral 216a for distinguishing purposes and is hereinafter referred to as a main conductive trunk.

Next, with the main conductive trunk 216a serving as mask, an anisotropic etching process, such as a plasma dry-etching process, is performed to etch away the unmasked part of the insulating layer 212 (FIG. 2C) to a predefined depth in the insulating layer 212 but not exposing the etch-end layer 210. The remaining part of the insulating layer is here designated by the reference numeral 212a for distinguishing purpose.

Subsequently, another conductive layer 218 is formed over the entire top surface of the wafer, covering all the exposed surfaces of the remaining insulating layer 212a and the main conductive trunk 216a. The conductive layer 218 can be formed through, for example, a first step of depositing polysilicon through a CVD process over the wafer to a predefined thickness, and a second step of doping an impurity element, such as N-type impurity ions, into the polysilicon layer to increase the conductivity thereof.

Figure 2E:
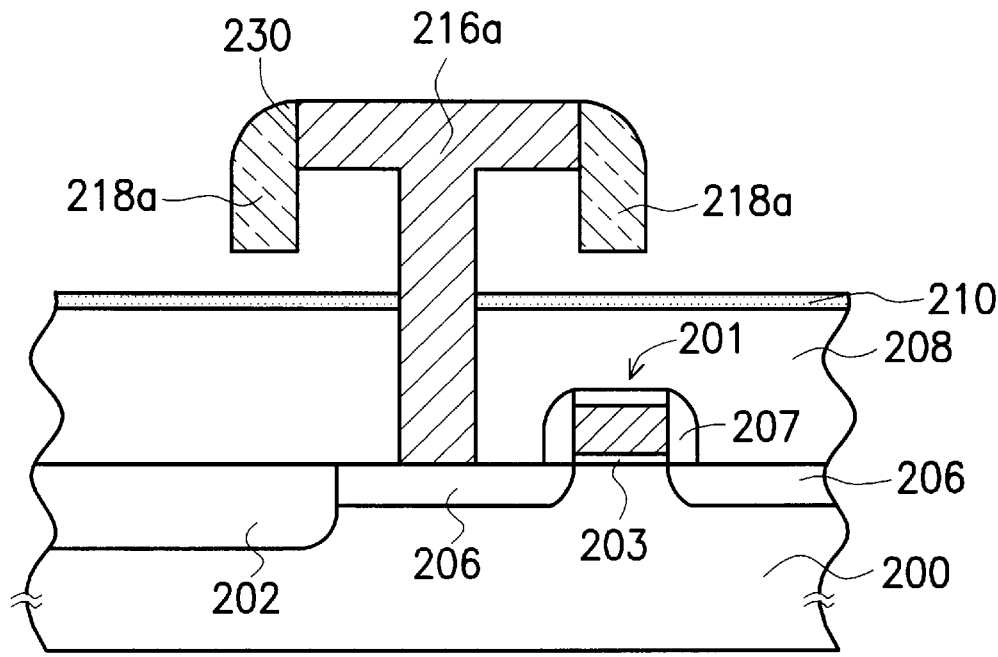

Referring further to FIG. 2E in the subsequent step, an anisotropic etch-back process, such as a dry-etching process is performed on the wafer to remove part of the conductive layer 218 until the topmost surface of the main conductive trunk 216a and the topmost surface of the insulating layer 212a are exposed. The remaining part of the conductive layer 218 is here designated by the reference numeral 218a for distinguishing purpose and is hereinafter referred to as an overhanging conductive branch to the main conductive trunk 216a. After this, the entire insulating layer 212a is etched away through an isotropic etching process, such as a wet-etching process using the hydrofluoric acid (HF) as etchant. The overhanging conductive branch 218a and the main conductive trunk 216a in combination constitute a tree-like electrode structure, which serves as a storage electrode connected to one of the source/drain regions 206 of the TFET 201.

Figure 2F:
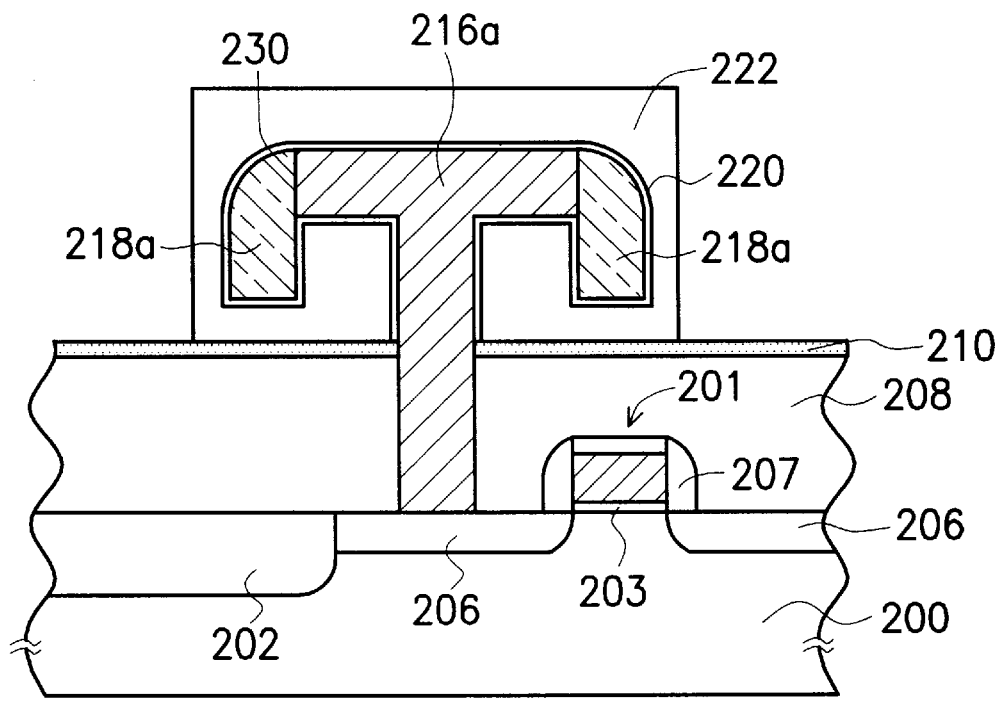

Referring further to FIG. 2F, in the subsequent step, a thin dielectric film 220 is formed over all the exposed surfaces of the storage electrode (i.e., the combined structure of the main conductive trunk 216a and the overhanging conductive branch 218a). The dielectric film 220 is formed from a dielectric material with a high dielectric constant, such as silicon oxide, silicon nitride/silicon oxide (NO), silicon oxide/silicon nitride/silicon oxide (ONO), $Ta_2O_5$, $Pb(Zr, Ti)O_3$, which is also called PZT, or $(Ba, Sr) TiO_3$ which is also called BST.

Subsequently, a cell electrode 222 is formed over the dielectric film 220. The cell electrode 222 can be formed through, for example, a first step of depositing polysilicon over the wafer to a predefined thickness through a CVD process, a second step of doping an impurity elenment into the polysilicon layer to increase the conductivity thereof, and a third step of performing a selective removal process to remove a selected part of the doped polysilicon layer beyond a predefined range from the bottom electrode.

The cell electrode 222, the dielectric film 220, and the storage electrode (i.e., the combined structure of the main conductive trunk 216a and the overhanging conductive branch 218a) in combination constitute a capacitor structure, with the root of the main conductive trunk 216a being electrically connected to one of the source/drain regions 206 of the TFET 201 in this DRAM cell.

The combined structure of the main conductive trunk 216a and the overhanging conductive branch 218a serves as a tree-like electrode structure for the data-storage capacitor, whose tree-like shape allows an increased surface area to provide an increased capacitance to the data-storage capacitor. The method of the invention thus allows the resulting data-storage capacitor to be large in capacitance and also allows the DRAM manufacturing process to have a higher yield rate. The use and manufacture of the DRAM are thus very cost-effective.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a data-storage capacitor for a DRAM device fabricated over a semiconductor substrate, with the substrate being already formed with a TFET having a gate and a pair of source/drain regions, the method comprising the steps of:

forming a dielectric layer over the substrate, covering the gate and the source/drain regions of the TFET;

forming an etch-end layer over the dielectric layer;

forming an insulating layer over the etch-end layer;

forming a contact hole which penetrates successively through the insulating layer, the etch-end layer, and the dielectric layer to expose a selected one of the source/drain regions of the TFET;

depositing a conductive material into the contact hole and over the insulating layer to form a first conductive layer;

performing a selective removal process to remove a selected part of the first conductive layer that is laid beyond a predefined range around the contact hole, with the remaining part of the first conductive layer serving as a main conductive trunk;

performing an etching process with the main conductive trunk serving as mask to thereby etch the unmasked part of the insulating layer until reaching a predefined depth into the insulating layer but not exposing the etch-end layer;

forming an overhanging conductive branch to the main conductive trunk, the overhanging conductive branch and the main conductive trunk in combination constituting a storage electrode which is electrically connected to the selected one of the source/drain regions of the TFET;

performing an etching process with the etch-end layer serving as etch-end point to thereby etch away all the remaining part of the insulating layer;

forming a dielectric film over all the exposed surfaces of the storage electrode; and forming a conductive block covering all the exposed surfaces of the dielectric film to serve as a cell electrode;

wherein the cell electrode, the dielectric film, and the storage electrode in combination constitute the intended data-storage capacitor.

2. The method of claim 1, wherein the first conductive layer is formed from doped polysilicon.

3. The method of claim 1, wherein the etch-end layer has a smaller etching rate than the overlying insulating layer.

4. The method of claim 3 wherein the etch-end layer is formed from silicon nitride.

5. The method of claim 3 wherein the etch-end layer is formed from silicon-oxy-nitride.

6. The method of claim 3 wherein the insulating layer is formed from silicon oxide.

7. The method of claim 1, wherein the etching process to etch away part of the insulating layer to the predefined depth is an anisotropic etching process.

8. The method of claim 7, wherein the anisotropic etching process is a dry-etching process.

9. The method of claim 1 wherein the overhanging conductive branch is formed by the steps of:

forming a second conductive layer over the remaining part of the insulating layer after the etching process; and performing an etch-back process on the second conductive layer until the surface of the main conductive trunk and the surface of the remaining insulating layer are exposed; the remaining part of the second conductive layer then serving as the overhanging conductive branch.

10. The method of claim 9, wherein the second conductive layer is formed from doped polysilicon.

11. The method of claim 1, wherein the overhanging conductive branch is formed from doped polysilicon.

12. The method of claim 1, wherein the insulating layer is removed through an isotropic etching process.

13. The method of claim 12, wherein the isotropic etching process is a wet-etching process.

14. The method of claim 1, wherein the dielectric film is formed from silicon oxide.

15. The method of claim 1, wherein the dielectric film is formed from NO structure.

16. The method of claim 1, wherein the dielectric film is formed from ONO structure.

17. The method of claim 1, wherein the dielectric film is formed from $Ta_2O_5$.

18. The method of claim 1, wherein the cell electrode of the data-storage capacitor is formed from doped polysilicon.

19. A method for fabricating a data-storage capacitor for a DRAM device fabricated over a semiconductor substrate, with the substrate being already formed with a TFET having a gate and a pair of source/drain regions, the method comprising the steps of:

forming a dielectric layer over the substrate, covering the gate and the source/drain regions of the TFET;

forming a layer of silicon nitride over the dielectric layer;

forming a layer of silicon oxide over the silicon nitride layer, forming a contact hole which penetrates successively through the silicon oxide layer, the silicon nitride layer, and the dielectric layer to expose a selected one of the source/drain regions of the TFET:

depositing polysilicon into the contact hole and over the silicon oxide layer to form a polysilicon layer;

performing a selective removal process to remove a selected part of the polysilicon layer that is laid beyond a predefined range about the contact hole, with the remaining part of the polysilicon layer serving as a main conductive trunk;

performing an anisotropic etching process with the main conductive trunk serving as mask to thereby etch the unmasked part of the silicon oxide layer until reaching a predefined depth into the silicon oxide layer but not exposing the silicon nitride layer;

forming a second polysilicon layer over the remaining silicon oxide layer;

performing an etch-back process on the second polysilicon layer until the surface of the main conductive trunk and the surface of the remaining silicon oxide layer are exposed, the remaining part of the second polysilicon layer then serving as an overhanging conductive branch to the main conductive trunk, and the overhanging conductive branch and the main conductive trunk in combination constituting a storage electrode which is electrically connected to the selected one of the source/drain regions of the TFET;

performing an isotropic etching process with the silicon nitride layer serving as an etch-end point to thereby etch away all the remaining part of the silicon oxide layer;

forming a dielectric film over all the exposed surfaces of the storage electrode; and forming a third polysilicon layer over the etch-end layer to a predefined thickness covering all the exposed surfaces of the dielectric film; and removing a selected part of the third polysilicon layer beyond a predefined range from the storage electrode, the remaining part of the third polysilicon layer serving as a cell electrode;

wherein the cell electrode, the dielectric film, and the storage electrode in combination constitute the intended data-storage capacitor.

20. The method of claim 19, wherein the dielectric film is formed from a dielectric material selected from the group consisting of silicon oxide, NO structure, ONO structure, and $Ta_2O_5$.

* * * * *